(12) United States Patent
Liao et al.

(10) Patent No.: US 11,051,402 B2
(45) Date of Patent: Jun. 29, 2021

(54) FLUORINE-CONTAINING SUBSTRATE, COPPER CLAD LAMINATE, AND PRINTED CIRCUIT BOARD

(71) Applicant: NAN YA PLASTICS CORPORATION, Taipei (TW)

(72) Inventors: Te-Chao Liao, Taipei (TW); Hao-Sheng Chen, Taipei (TW); Chih-Kai Chang, Taipei (TW); Hung-Yi Chang, Taipei (TW)

(73) Assignee: NAN YA PLASTICS CORPORATION, Taipei (TW)

( * ) Notice: Subject to any disclaimer, the term of this patent is extended or adjusted under 35 U.S.C. 154(b) by 0 days.

(21) Appl. No.: 16/664,075

(22) Filed: Oct. 25, 2019

(65) Prior Publication Data

US 2020/0389974 A1 Dec. 10, 2020

(30) Foreign Application Priority Data

Jun. 10, 2019 (TW) .................................. 108119921

(51) Int. Cl.
*H05K 1/05* (2006.01)
*H05K 1/03* (2006.01)

(52) U.S. Cl.
CPC ........... *H05K 1/053* (2013.01); *H05K 1/0366* (2013.01); *H05K 2201/015* (2013.01)

(58) Field of Classification Search
CPC .... H05K 1/0306; H05K 1/036; H05K 1/0366; H05K 1/0373; H05K 1/038; H05K 1/053; H05K 2201/015; H05K 2201/0183; H05K 2201/0187; H05K 2201/0195; H05K 2201/02; H05K 2201/0209; H05K 2201/0266; H05K 2201/0269;
(Continued)

(56) References Cited

U.S. PATENT DOCUMENTS

| 4,886,699 A * | 12/1989 | Carroll ..................... B32B 5/26 442/235 |
| 2005/0025967 A1* | 2/2005 | Lawton ................. C03C 25/323 428/375 |

(Continued)

FOREIGN PATENT DOCUMENTS

| TW | 201700565 A | 1/2017 |
| TW | 201912412 A | 4/2019 |

OTHER PUBLICATIONS

Machine Translation of Nippon (TW201912412A) provided with Office Action (dated 2019).*

*Primary Examiner* — Roshn K Varghese
(74) *Attorney, Agent, or Firm* — Li & Cai Intellectual Property (USA) Office

(57) ABSTRACT

A fluorine-containing substrate, a copper clad laminate, and a printed circuit board are provided. The fluorine-containing substrate includes a reinforcing material layer and a fluorine-containing resin layer. The reinforcing material layer includes a substrate and a first inorganic filler. The first inorganic filler is attached on the substrate and is dispersed in the reinforcing material layer. The particle size of the first inorganic filler ranges from 0.02 μm to 1 μm. The reinforcing material layer is covered by the fluorine-containing resin layer. The fluoride resin layer includes a second inorganic filler whose particle size ranges between a value larger than 1 μm and 100 μm.

10 Claims, 4 Drawing Sheets

(58) Field of Classification Search
CPC ..... H05K 2201/0275; H05K 2201/029; H05K 2201/0263; B32B 27/322
See application file for complete search history.

(56) References Cited

U.S. PATENT DOCUMENTS

| | | | |
|---|---|---|---|
| 2005/0153610 A1* | 7/2005 | McCarthy | C09D 127/12 442/59 |
| 2010/0080959 A1* | 4/2010 | Harvey | C08L 27/18 428/172 |
| 2018/0242443 A1* | 8/2018 | Tanaka | H05K 3/0011 |

* cited by examiner

FLUORINE-CONTAINING SUBSTRATE, COPPER CLAD LAMINATE, AND PRINTED CIRCUIT BOARD

CROSS-REFERENCE TO RELATED PATENT APPLICATION

This application claims the benefit of priority to Taiwan Patent Application No. 108119921, filed on Jun. 10, 2019. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a fluorine-containing substrate, a copper clad laminate, and a printed circuit board, and more particularly to a fluorine-containing substrate, a copper clad laminate, and a printed circuit board suitable for the high frequency transmission.

BACKGROUND OF THE DISCLOSURE

With the development of technology, high frequency transmission is an inevitable trend. In response to the requirement of the high frequency transmission, the industry has focused more on the properties of a substrate of a printed circuit board. Generally, a high frequency substrate requires properties of high dielectric constant (Dk), low dielectric dissipation factor (Df), and good thermal conductivity, that is, the high frequency substrate has good dielectric properties and good thermal conductivity. Therefore, high frequency substrate can be applied to the high frequency printed circuit board of the antenna in base-station, satellite radar, automobile radar, wireless communication antenna, or power amplifier.

A fluorine-containing substrate is widely applied to the high frequency substrate for its low dielectric dissipation factor and its adjustable dielectric constant. The dielectric constant of the fluorine-containing substrate can be adjusted by regulating the content of a resin to form the fluorine-containing substrate. In the related art, a large amount of the inorganic filler is added in the fluorine-containing substrate to enhance the dielectric properties and thermal conductivity. However, the excessive content of the inorganic filler in the fluorine-containing substrate may weaken the adhesive force between the copper foil and the fluorine-containing substrate, so that the copper foil is easily peeled from the fluorine-containing substrate during the drilling process or the hole-plating process. In addition, when the content of the inorganic filler in the fluorine-containing substrate is excessive, the inorganic filler is difficult to be dispersed uniformly, resulting in decreases of the uniformity and the stability of the fluorine-containing substrate.

Accordingly, to overcome the problems of the poor adhesive reliability caused by the excessive addition of the inorganic filler, an adhesive layer is disposed between the copper foil and the fluorine-containing substrate or an adhesive resin is coated between the copper foil and the fluorine-containing substrate in related art, so as to enhance the adhesive force between the copper foil and the fluorine-containing substrate. However, the disposition of the adhesive layer or the coating of the adhesive resin has disadvantages of high cost and tedious process. Moreover, the existence of the adhesive layer or the adhesive resin may negatively impact the overall properties of the fluorine-containing substrate, so that the fluorine-containing substrate cannot have both good dielectric properties and high thermal conductivity.

SUMMARY OF THE DISCLOSURE

In response to the above-referenced technical inadequacies, the present disclosure provides a fluorine-containing substrate, a copper clad laminate, and a printed circuit board.

In one aspect, the present disclosure provides a fluorine-containing substrate. The fluorine-containing substrate includes a reinforcing material layer and a fluorine-containing resin layer. The reinforcing material layer is covered by the fluorine-containing resin layer. The reinforcing material layer includes a substrate and a first inorganic filler. The first inorganic filler is attached on the substrate and dispersed in the reinforcing material layer. The first inorganic filler has a particle size ranging from 0.02 µm to 1 µm. The fluorine-containing resin layer includes a second inorganic filler. The second inorganic filler has a particle size ranging between a value larger than 1 µm and 100 µm.

In one aspect, the present disclosure provides a copper clad laminate. The copper clad laminate includes a fluorine-containing substrate and a copper foil disposed on the fluorine-containing substrate. The fluorine-containing substrate includes a reinforcing material layer and a fluorine-containing resin layer. The reinforcing material layer is covered by the fluorine-containing resin layer. The reinforcing material layer includes a substrate and a first inorganic filler. The first inorganic filler is attached on the substrate and dispersed in the reinforcing material layer. The first inorganic filler has a particle size ranging from 0.02 µm to 1 µm. The fluorine-containing resin layer includes a second inorganic filler. The second inorganic filler has a particle size ranging between a value larger than 1 µm and 100 µm.

In one aspect, the present disclosure provides a printed circuit board. The printed circuit board includes a fluorine-containing substrate and a circuit layer disposed on the fluorine-containing substrate. The fluorine-containing substrate includes a reinforcing material layer and a fluorine-containing resin layer. The reinforcing material layer is covered by the fluorine-containing resin layer. The reinforcing material layer includes a substrate and a first inorganic filler. The first inorganic filler is attached on the substrate and dispersed in the reinforcing material layer. The first inorganic filler has a particle size ranging from 0.02 µm to 1 µm. The fluorine-containing resin layer includes a second inorganic filler. The second inorganic filler has a particle size ranging between a value larger than 1 µm and 100 µm.

Therefore, the fluorine-containing substrate, the copper clad laminate, and the printed circuit board of the present disclosure have the technical features of "the reinforcing material layer covered by the fluorine-containing resin layer", "the particle size of the first inorganic filler ranging from 0.02 µm to 1 µm", and "the particle size of the second inorganic filler ranging between a value larger than 1 µm and 100 µm" so as to achieve good dielectric properties, high thermal conductivity, and good adhesive reliability.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The present disclosure will become more fully understood from the following detailed description and accompanying drawings.

DETAILED DESCRIPTION OF THE EXEMPLARY EMBODIMENTS

Figure 1:
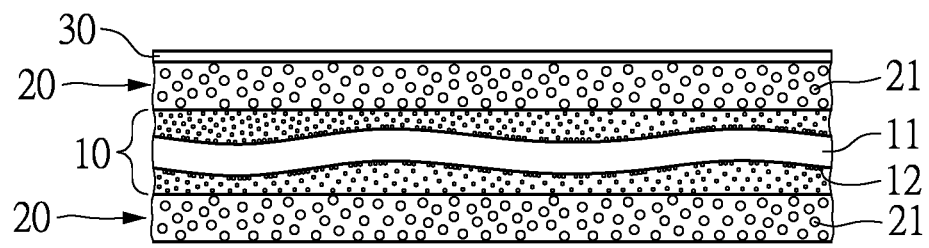
FIG. 1 is a side cross-sectional view of a copper clad laminate according to a first embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

Referring to FIG. 1, FIG. 1 is a side cross-sectional view of a copper clad laminate according to a first embodiment of the present disclosure. A copper clad laminate 1 provided by the present disclosure includes a reinforcing material layer 10, a fluorine-containing resin layer 20, and a copper foil 30.

The copper clad laminate 1 of the present disclosure has excellent dielectric properties and thermal conductivity so that the copper clad laminate 1 can be applied to the high frequency printed circuit board. In addition, the copper clad laminate 1 of the present disclosure can have high peeling strength without disposing an adhesive layer or coating an adhesive resin. Even in the subsequent drilling process or the subsequent hole-plated process, the copper foil 30 still has good adhesive reliability so that the copper foil 30 will not easily be separated from the fluorine-containing resin layer 20.

In the embodiment, the reinforcing material layer 10 includes a substrate 11 and a first inorganic filler 12. The reinforcing material layer 10 has a thickness of 40 μm to 100 μm. The substrate 11 can be a fiber cloth or an insulating paper, but is not limited thereto. The material of the substrate 11 can be glass fiber, carbon fiber, graphite fiber, aluminum oxide fiber, silicon carbide fiber, silicon nitride fiber, boron fiber, or any combination thereof. Preferably, the material of the substrate 11 can be glass fiber, but is not limited thereto.

The first inorganic filler 12 is attached on the substrate 11, and uniformly dispersed in the reinforcing material layer 10 exclusive of the substrate 11. The first inorganic filler 12 has a particle size ranging from 0.02 μm to 1 μm, such as all positive integers from 20 nm to 1000 nm. The first inorganic filler 12 can be silicon dioxide, titanium dioxide, aluminum hydroxide, aluminum oxide, magnesium hydroxide, magnesium oxide, calcium carbonate, boron oxide, calcium oxide, strontium titanate, barium titanate, calcium titanate, magnesium titanate, boron nitride, aluminum nitride, silicon carbide, cerium dioxide, or any combination thereof.

The silicon dioxide can be a silicon dioxide in a melted state or a silicon dioxide in a crystalline state. Considering the dielectric properties of the overall copper clad laminate 1, the silicon dioxide is preferably silicon dioxide at a melted state. The titanium dioxide can be a titanium dioxide in the rutile phase, a titanium dioxide in the anatase phase, or a titanium dioxide in the brookite phase. Considering the dielectric properties of the overall copper clad laminate 1, the titanium dioxide is preferably the titanium dioxide in the rutile phase.

Figure 2:
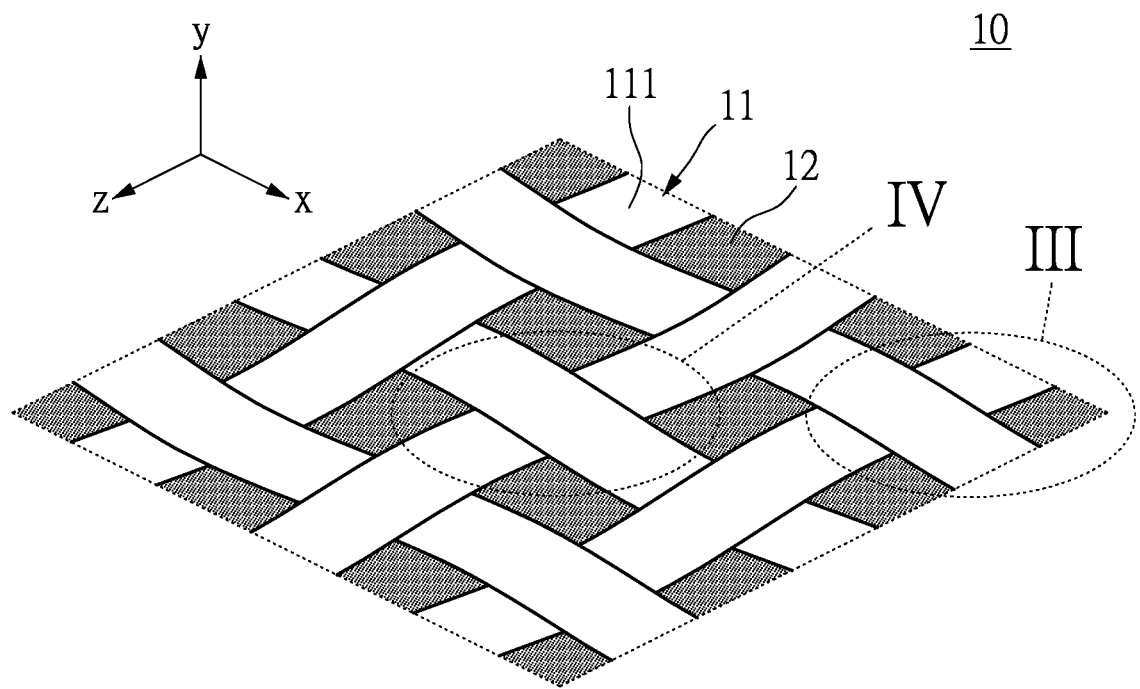
FIG. 2 is a perspective schematic view of a reinforcing material layer of FIG. 1.
Figure 3:
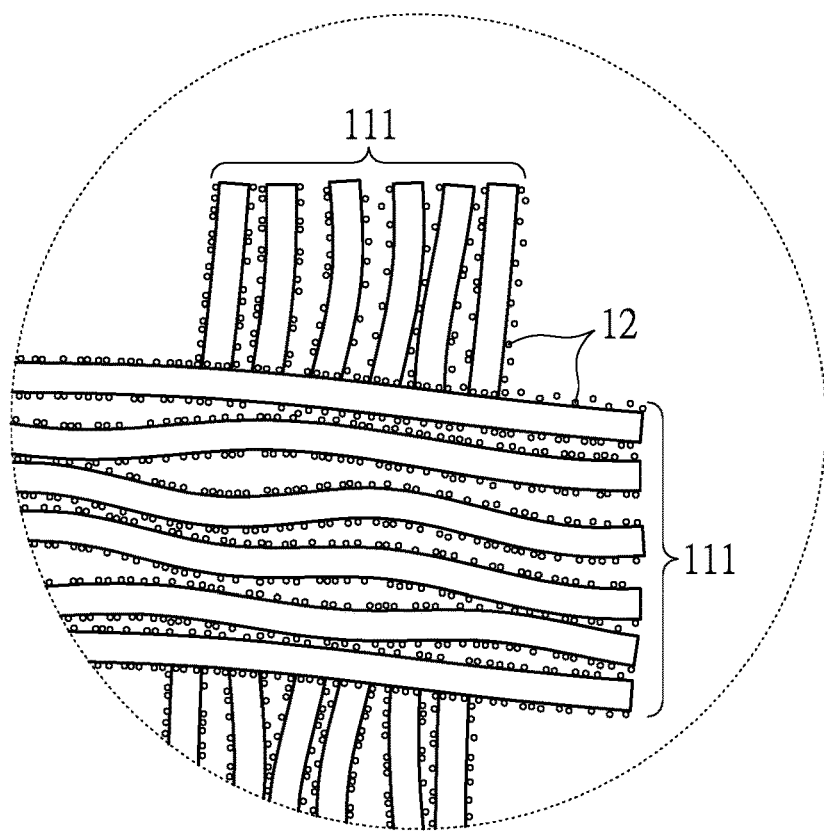
FIG. 3 is a partial enlarged view of section III of FIG. 2.
Figure 4:
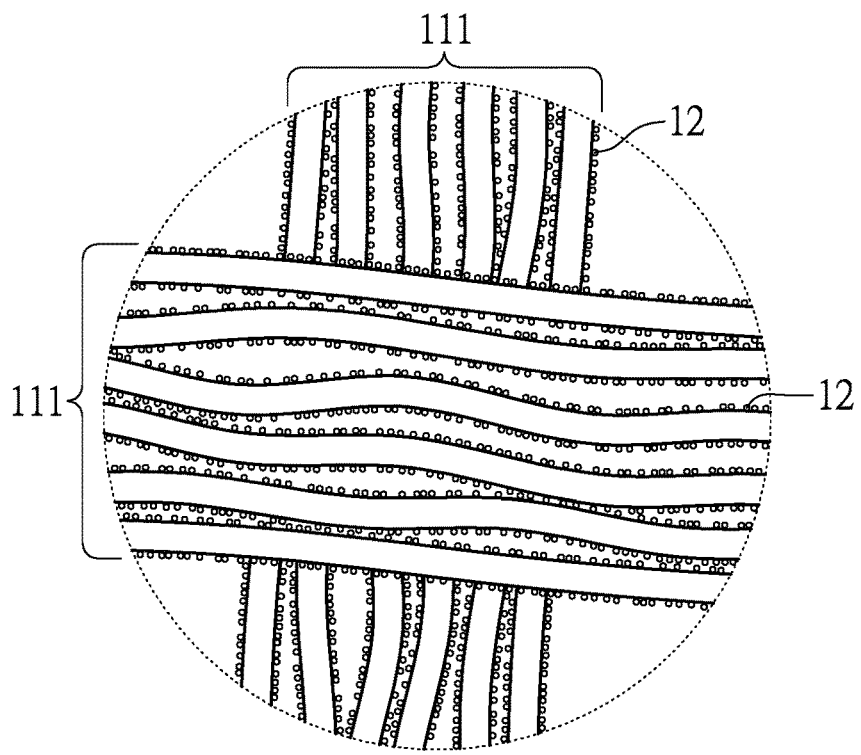
FIG. 4 is a partial enlarged view of section IV of FIG. 2.

Referring to FIG. 2 to FIG. 4, FIG. 2 is a perspective schematic view of a reinforcing material layer of FIG. 1. FIG. 3 and FIG. 4 are respectively partial enlarged views of section III and section IV of FIG. 2. In the embodiment, the substrate 11 is a fiber cloth which is weaved from yarns 111. Referring to FIG. 2, in the microscopic structure of the reinforcing material layer 10, a part of the first inorganic filler 12 is filled in voids of the fiber cloth. Referring to FIG. 3 and FIG. 4, another part of the first inorganic filler 12 is filled in gaps among the yarns 111 in the terminal sections or the middle section. The addition of the first inorganic filler 12 can enhance the structural strength of the substrate 11, and further enhance the stability of the dielectric constant and the stability of dimension of the reinforcing material layer 10 on X-Z plane.

Referring to FIG. 1, the reinforcing material layer 10 is covered by the fluorine-containing resin layer 20. Specifically, the fluorine-containing resin layer 20 formed on two opposite surfaces of the reinforcing material layer 10 grips the reinforcing material layer 10 as shown in FIG. 1. Further, the reinforcing material layer 10 can also be completely covered by the fluorine-containing resin layer 20. The fluorine-containing resin layer 20 has a thickness ranging from 70 μm to 180 μm.

The fluorine-containing resin layer 20 includes a second inorganic filler 21. The second inorganic filler 21 has a particle size ranging between a value larger than 1 μm and 100 μm, such as all positive integers from 1 μm to 100 μm. The second inorganic filler 21 is disposed on the reinforcing material layer 10 and dispersed in the fluorine-containing resin layer 20. The second inorganic filler 21 can be silicon dioxide, titanium dioxide, aluminum hydroxide, aluminum oxide, magnesium hydroxide, magnesium oxide, calcium carbonate, boron oxide, calcium oxide, strontium titanate, barium titanate, calcium titanate, magnesium titanate, boron nitride, aluminum nitride, silicon carbide, cerium dioxide, or any combination thereof.

The reinforcing material layer 10 and the fluorine-containing resin layer 20 previously mentioned compose a structure referred to as a fluorine-containing substrate. The material of the first inorganic filler 12 and the material of the second inorganic filler 21 in the fluorine-containing substrate can be the same or different. In an embodiment, the material of the first inorganic filler 12 and the material of the second inorganic filler 21 are the same. Therefore, the compatibility between the reinforcing material layer 10 and the fluorine-containing resin layer 20 can be enhanced so that the peeling strength of the copper clad laminate 1 can be increased. In another embodiment, the material of the first inorganic filler 12 and the material of the second inorganic filler 21 are different so that the dielectric constant or other properties of the copper clad laminate 1 can be adjusted by selecting different materials as the inorganic filler.

Figure 7:
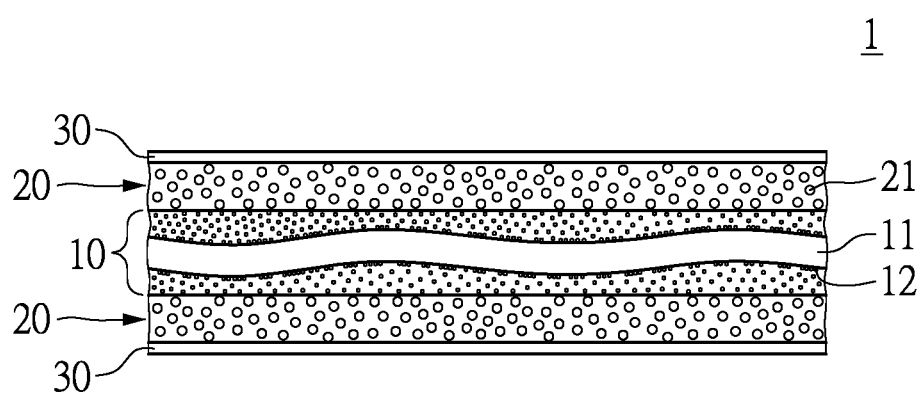
FIG. 7 is a side cross-sectional view of the copper clad laminate according to a third embodiment of the present disclosure.

The copper foil 30 is disposed on the fluorine-containing resin layer 20 and quantity of the copper foil 30 disposed on the fluorine-containing resin layer 20 can be adjusted according to different types of copper clad laminate 1. For example, a single-sided copper clad laminate as shown in FIG. 1 can be manufactured by disposing one copper foil 30 on the fluorine-containing resin layer 20. A double-sided copper clad laminate as shown in FIG. 7 can be manufactured by disposing two copper foils 30 respectively on two opposite surfaces of the fluorine-containing resin layer 20. The specific structure of the double-sided copper clad laminate is illustrated below.

Figure 5:
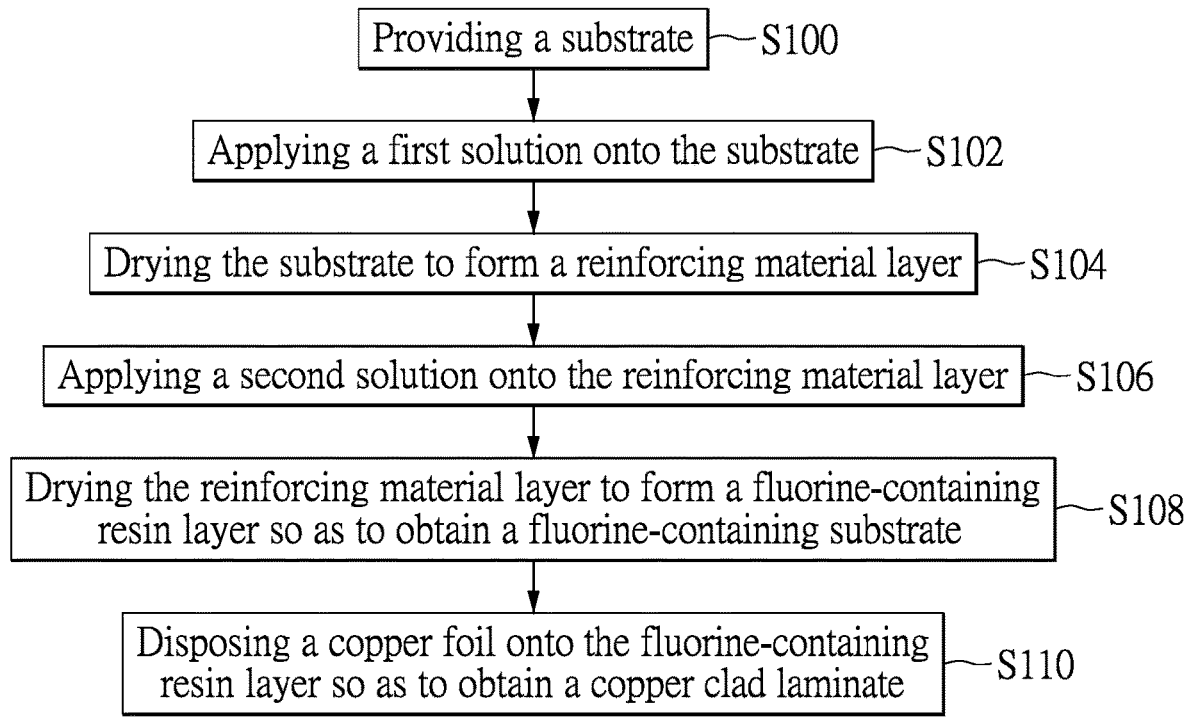
FIG. 5 is a flowchart of a method for manufacturing the copper clad laminate of the present disclosure.

Referring to FIG. 1 and FIG. 5, FIG. 5 is a flowchart of a method for manufacturing the copper clad laminate 1 of the present disclosure. The method for manufacturing the copper clad laminate 1 includes steps of: providing the substrate 11 (step S100); applying a first solution onto the substrate 11 (step S102); and drying the substrate 11 with the first solution to form a reinforcing material layer 10 (step S104).

In step S102, the way of applying the first solution onto the substrate 11 can selectively be immersing the substrate 11 into the first solution or coating the first solution on the substrate 11. The first solution contains 50 wt % to 80 wt % of a first inorganic filler 12, 10 wt % to 40 wt % of a fluorine-containing resin, 1 wt % to 10 wt % of a fluorine-containing polymer, 0.1 wt % to 50 wt % of a low molecular weight polytetrafluoroethylene (PTFE), and 0.1 wt % to 10 wt % of an immersing auxiliary.

In the embodiment, the fluorine-containing resin can be polytetrafluoroethylene resin, but is not limited thereto. The fluorine-containing polymer can be polyfluoroalkoxy (PFA) or fluorinated ethylene propylene (FEP). The low molecular weight polytetrafluoroethylene can be prepared through a thermal degradation or a radiolytic degradation. The molecular weight of the low molecular weight polytetrafluoroethylene ranges from 2,000 to 200,000; preferably, the molecular weight of the low molecular weight polytetrafluoroethylene ranges from 10,000 to 100,000. The immersing auxiliary can be hydroxyethyl cellulose, nitrocellulose, polymethylstyrene, polymethyl methacrylate, polyethylene glycol or any combination thereof, but is not limited thereto. The addition of the immersing auxiliary can adjust the viscosity of the fluorine-containing resin to prevent the reinforcing material layer 10 from having a rough surface due to the excessive viscosity and forming holes due to the insufficient viscosity, so as to maintain the film flatness of the reinforcing material layer 10.

After applying the first solution on the substrate 11, the first inorganic filler 12 will be filled in the holes of the substrate 11 and uniformly dispersed on the substrate 11. The addition of the first inorganic filler 12 can enhance the structural strength of the substrate 11 and increase the uniformity of the dielectric constant of the reinforcing material layer 10 on an X-Z plane. It should be noted that since the first inorganic filler 12 is filled in the holes of the substrate 11, the adhesive reliability of the reinforcing material layer 10 will not be negatively impacted by the high content of the first inorganic filler 12.

In step S104, drying the substrate 11 with the first solution to form the reinforcing material layer 10 further includes a three-stage heating process. The three-stage heating process includes: drying the substrate 11 at a temperature ranging from 80° C. to 120° C., roasting the substrate 11 at a temperature ranging from 200° C. to 240° C., and sintering the substrate 11 at a temperature ranging from 340° C. to 360° C. The drying step, the roasting step, and the sintering step are all performed for a duration of at least 20 minutes. However, the present disclosure is not limited to that disclosed herein.

The method for manufacturing the copper clad laminate 1 includes steps of: applying a second solution onto the reinforcing material layer 10 (step S106); and drying the reinforcing material layer 10 with the second solution to form a fluorine-containing resin layer 20 on the reinforcing material layer 10 so as to obtain a fluorine-containing substrate (step S108).

In step S106, the way of applying the second solution onto the reinforcing material layer 10 can selectively be immersing the reinforcing material layer 10 into the second solution or coating the second solution on the reinforcing material layer 10. The second solution contains 20 wt % to 70 wt % of a second inorganic filler 21, 10 wt % to 70 wt % of a fluorine-containing resin, 1 wt % to 10 wt % of a fluorine-containing polymer, 0.1 wt % to 50 wt % of a low molecular weight polytetrafluoroethylene (PTFE), and 0.1 wt % to 10 wt % of an immersing auxiliary. The fluorine-containing resin, the fluorine-containing polymer, the low molecular weight polytetrafluoroethylene and the immersing auxiliary in the second solution are similar to those in the first solution, and will not be reiterated herein.

The fluorine-containing resin layer 20 can have excellent processability by adjusting the content of the fluorine-containing polymer. For example, if the content of the fluorine-containing polymer in the fluorine-containing resin layer 20 is higher than 10 wt %, flow glue may be generated in the thermal compression process of the fluorine-containing resin layer 20. If the content of the fluorine-containing polymer in the fluorine-containing resin layer 20 is lower than 1 wt %, the copper foil 30 may be easily peeled from the fluorine-containing resin layer 20.

Because of the short molecule chain of the low molecular weight polytetrafluoroethylene (whose molecular weight ranging from 2,000 to 200,000; preferably, the molecular weight of the low molecular weight polytetrafluoroethylene ranging from 10,000 to 100,000), the molecule of the low molecular weight polytetrafluoroethylene has good arranging ability. Therefore, during the sintering process or the laminating process at an appropriate temperature, the addition of the low molecular weight polytetrafluoroethylene can increase the crystillinity of the fluorine-containing resin layer 20 and further increase the heat transfer coefficient of the fluorine-containing resin layer 20.

After applying the second solution onto the reinforcing material layer 10, the second inorganic filler 21 is disposed on the reinforcing material layer 10.

In step S108, drying the reinforcing material layer 10 with the second solution to form the fluorine-containing substrate further includes a three-stage heating process. The three-stage heating process includes: drying the reinforcing material layer 10 at a temperature ranging from 80° C. to 120° C., roasting the reinforcing material layer 10 at a temperature ranging from 200° C. to 240° C., and sintering the reinforcing material layer 10 at a temperature ranging from 340° C. to 360° C. The drying step, the roasting step, and the sintering step are all performed for a duration of at least 20 minutes. However, the present disclosure is not limited to that disclosed herein.

In other embodiments, the step S106 and the step S108 can be repeated multiple times. In other words, the step of applying the second solution onto the reinforcing material layer 10 and the step of drying the reinforcing material layer 10 with the second solution can be repeated so as to form the fluorine-containing resin layer 20 with a specific thickness. Because the fluorine-containing resin layer 20 has an adjustable thickness, the preferable thickness of the fluorine-containing resin layer 20 ranges from 50 µm to 150 µm, such as all positive integers from 50 µm to 150 µm.

Finally, the method for manufacturing the copper clad laminate 1 includes a step of: disposing the copper foil 30 onto the fluorine-containing resin layer 20 so as to obtain a copper clad laminate (step S110). The copper foil 30 is thermal compressed on the fluorine-containing resin layer 20 at a temperature of 340° C. to 360° C. and a pressure of 45 kg/cm$^2$ to 55 kg/cm$^2$ for 2 hours. Subsequently, the copper clad laminate is cooled down to 250° C. by a cooling rate of 1° C./min to 4° C./min in advance, and then is cooled down to room temperature by a cooling rate of 10° C./min so as to increase the crystallinity of the fluorine-containing resin layer 20 and increase the thermal conductivity of the copper clad laminate 1. However, the present disclosure is not limited to that disclosed herein.

Based on the illustration, the reinforcing material layer 10 can be formed by the step S100 to the step S104 mentioned previously. The fluorine-containing resin layer 20 can be formed onto the reinforcing material layer 10 by the step S106 and the step S108 mentioned previously. It is worth mentioning that the method for manufacturing the fluorine-containing substrate is not limited thereto. In operation, the step S100 to the step S108 can be repeated to form a multi-layer structure stacked by the fluorine-containing resin layer 20, the reinforcing material layer 10, and the fluorine-containing resin layer 20. In addition, a plurality of the multi-layer structures including the fluorine-containing resin layer 20, the reinforcing material layer 10, and the fluorine-containing resin layer 20 can be stacked together to reach an expected thickness as shown in FIG. 6.

Figure 6:
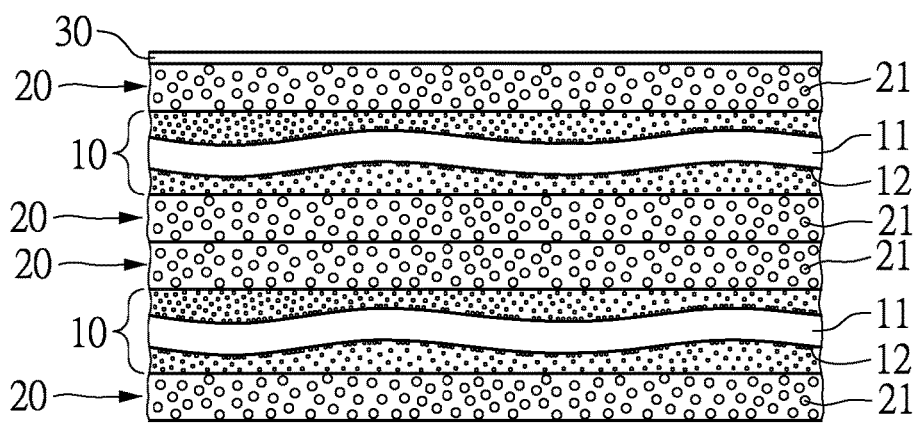
FIG. 6 is a side cross-sectional view of the copper clad laminate according to a second embodiment of the present disclosure.

FIG. 6 is a side cross-sectional view of the copper clad laminate according to a second embodiment of the present disclosure. In FIG. 6, the fluorine-containing substrate includes the fluorine-containing resin layer 20, the reinforcing material layer 10, the fluorine-containing resin layer 20, the fluorine-containing resin layer 20, the reinforcing material layer 10, and the fluorine-containing resin layer 20 which are stacked in sequence, and the copper foil 30 is disposed on the fluorine-containing substrate to form a single-sided copper clad laminate.

In addition, a double-sided copper clad laminate can be manufactured by a similar method mentioned above. The double-sided copper clad laminate contains two copper foils 30 respectively disposed on two opposite surfaces of the fluorine-containing substrate. Referring to FIG. 7, FIG. 7 is a side cross-sectional view of the copper clad laminate according to a third embodiment of the present disclosure. The difference of the copper clad laminate 1 in FIG. 7 and the copper clad laminate 1 in FIG. 1 is that two copper foils 30 are respectively disposed on two opposite surfaces of the fluorine-containing substrate. The reinforcing material layer 10, the fluorine-containing layer 20, and the copper foil 30 are similar as in previous embodiments, and will not be reiterated herein.

In other embodiments, the copper foil 30 can be patterned to form a circuit layer through etching and developing processes. Therefore, a printed circuit board having good dielectric properties and high thermal conductivity can be manufactured and the printed circuit board is suitable for the high frequency transmission.

To prove the good dielectric properties and high thermal conductivity of the copper clad laminate 1, different copper clad laminates 1 are prepared and the specific parameters for manufacturing the different copper clad laminates 1 are listed in Table 1 below. In addition, certain physical evaluations are carried out to the different copper clad laminates 1.

(1) Thermal conductivity: the thermal conductivity of the copper clad laminate 1 is measured by a thermal resistance and conductivity measurement apparatus (Longwin, LW-9389) according to ASTM-D5470 standard.

(2) Dielectric constant (10 GHz): the dielectric constant of the copper clad laminate 1 is measured by a dielectric analyzer (HP Agilent E4991A) at a frequency of 10 GHz.

(3) Dielectric dissipation factor (10 GHz): the dielectric dissipation factor of the copper clad laminate 1 is measured by a dielectric analyzer (HP Agilent E4991A) at a frequency of 10 GHz.

(4) Peeling strength: the peeling strength of the copper clad laminate 1 is measured according to IPC-TW-650-2.4.8 standard.

TABLE 1

| | | Example | | | | Comparative Example | | | |
|---|---|---|---|---|---|---|---|---|---|
| | | 1 | 2 | 3 | 4 | 1 | 2 | 3 | 4 |
| | | Component | | | | | | | |
| The first inorganic filler | Material | TiO$_2$ | SiO$_2$ | TiO$_2$ | SiO$_2$ | Al$_2$O$_3$ | BN | TiO$_2$ | SiO$_2$ |
| | Particle size µm) | 0.05 | 0.3 | 0.05 | 0.5 | 10 | 6 | 8 | 2 |
| | Content in the reinforcing material layer | 70 wt % | 50 wt % | 80 wt % | 50 wt % | 70 wt % | 50 wt % | 80 wt % | 65 wt % |

TABLE 1-continued

| | Example | | | | Comparative Example | | | |
|---|---|---|---|---|---|---|---|---|
| | 1 | 2 | 3 | 4 | 1 | 2 | 3 | 4 |
| Thickness of the reinforcing material layer (μm) | 40 | 40 | 40 | 60 | 40 | 40 | 40 | 60 |
| The second inorganic filler — Material | $Al_2O_3$ | BN | $TiO_2$ | $Al_2O_3$ | $Al_2O_3$ | BN | $TiO_2$ | $SiO_2$ |
| The second inorganic filler — Particle size (μm) | 10 | 6 | 8 | 10 | 10 | 6 | 8 | 2 |
| The second inorganic filler — Content in the fluorine-containing resin layer | 60 wt % | 20 wt % | 70 wt % | 50 wt % | 80 wt % | 50 wt % | 80 wt % | 65 wt % |
| Thickness of the fluorine-containing resin layer (μm) | 90 | 90 | 90 | 70 | 90 | 90 | 90 | 70 |
| Physical evaluation | | | | | | | | |
| Heat transfer coefficient (W/mK) | 1.0 | 1.8 | 1.2 | 0.87 | 0.93 | 1.3 | 1.01 | 0.75 |
| Dielectric constant (10 GHz) | 6.52 | 3.53 | 11.4 | 3.50 | 6.49 | 3.51 | 11.2 | 3.47 |
| Dielectric dissipation factor (10 GHz) | 0.0020 | 0.0015 | 0.0019 | 0.0020 | 0.0025 | 0.0021 | 0.0023 | 0.0031 |
| Peeling strength (lb/in) | 11.2 | 12.3 | 10.3 | 13.3 | 3.7 | 2.9 | 3.1 | 4.2 |

Based on the results in Table 1, the fluorine-containing substrate, the copper clad laminate 1, and the printed circuit board with good dielectric properties, high thermal conductivity, and high peeling strength can be prepared through regulating the particle size of the first inorganic filler 12 in the reinforcing material layer 10. Specifically, the heat transfer coefficient of the copper clad laminate 1 ranges from 0.7 W/mK to 1.8 W/mK, the dielectric constant (10 GHz) of the copper clad laminate 1 ranges from 3.5 to 11.4, the dielectric dissipation factor (10 GHz) of the copper clad laminate 1 ranges from 0.0015 to 0.0020, and the peeling strength of the copper clad laminate 1 ranges from 10.3 lb/in to 13.3 lb/in.

In conclusion, the fluorine-containing substrate, the copper clad laminate 1, and the printed circuit board of the present disclosure have the technical features of "the reinforcing material layer 10 covered by the fluorine-containing resin layer 20", "the particle size of the first inorganic filler 12 ranging from 0.02 μm to 1 μm", and "the particle size of the second inorganic filler 21 ranging between a value larger than 1 μm and 100 μm" to provide the fluorine-containing substrate, the copper clad laminate 1, and the printed circuit board with good dielectric properties, high thermal conductivity, and high peeling strength.

Further, the fluorine-containing substrate, the copper clad laminate 1, and the printed circuit board of the present disclosure have the technical features of "regulating the content of the first inorganic filler 12 in the reinforcing material layer 10", and "regulating the content of the second inorganic filler 21 in the fluorine-containing resin layer 20" to enhance the adhesive reliability as well as the dielectric properties and thermal conductivity.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A fluorine-containing substrate, comprising:
    a reinforcing material layer including a substrate and a plurality of first inorganic fillers, the first inorganic fillers being attached on the substrate and dispersed in the reinforcing material layer, and the first inorganic fillers having a particle size ranging from 0.02 μm to 1 μm; and
    a fluorine-containing resin layer covering the reinforcing material layer, the fluorine-containing resin layer including a plurality of second inorganic fillers, wherein the fluorine-containing resin layer is formed from a second solution containing 10 wt % to 70 wt % of a fluorine-containing resin, 1 wt % to 10 wt % of a fluorine-containing polymer, 0.1 wt % to 50 wt % of a low molecular weight polytetrafluoroethylene, and 0.1 wt % to 10 wt % of an immersing auxiliary, a content of the second inorganic fillers in the fluorine-containing resin layer is from 20 wt % to 70 wt %, and the second inorganic fillers have a particle size ranging between a value larger than 1 μm and 100 μm.

2. The fluorine-containing substrate according to claim 1, wherein the first inorganic fillers and the second inorganic fillers respectively and independently are silicon dioxide, titanium dioxide, aluminum hydroxide, aluminum oxide, magnesium hydroxide, magnesium oxide, calcium carbonate, boron oxide, calcium oxide, strontium titanate, barium titanate, calcium titanate, magnesium titanate, boron nitride, aluminum nitride, silicon carbide, cerium dioxide, or any combination thereof.

3. The fluorine-containing substrate according to claim 1, wherein the reinforcing material layer has a thickness ranging from 40 μm to 100 μm.

4. The fluorine-containing substrate according to claim 1, wherein the fluorine-containing resin layer has a thickness ranging from 70 μm to 180 μm.

5. The fluorine-containing substrate according to claim 1, wherein the substrate is a fiber cloth, and the first inorganic fillers are filled in voids of the fiber cloth and filled in gaps among yarns of the fiber cloth.

6. The fluorine-containing substrate according to claim 1, wherein a content of the first inorganic fillers in the reinforcing material layer is from 50 wt % to 80 wt %.

7. The fluorine-containing substrate according to claim 1, wherein the reinforcing material layer is completely covered by the fluorine-containing resin layer.

8. The fluorine-containing substrate according to claim 1, wherein the immersing auxiliary is selected from the group consisting of hydroxyethyl cellulose, nitrocellulose, polymethylstyrene, polymethyl methacrylate, and polyethylene glycol.

9. A copper clad laminate, comprising:
a fluorine-containing substrate including:
a reinforcing material layer including a substrate and a plurality of first inorganic fillers, the first inorganic fillers being attached on the substrate and dispersed in the reinforcing material layer; and the first inorganic fillers having a particle size ranging from 0.02 µm to 1 µm; and
a fluorine-containing resin layer covering the reinforcing material layer, the fluorine-containing resin layer including a plurality of second inorganic fillers, wherein the fluorine-containing resin layer is formed from a second solution containing 10 wt % to 70 wt % of a fluorine-containing resin, 1 wt % to 10 wt % of a fluorine-containing polymer, 0.1 wt % to 50 wt % of a low molecular weight polytetrafluoroethylene, and 0.1 wt % to 10 wt % of an immersing auxiliary, a content of the second inorganic fillers in the fluorine-containing resin layer is from 20 wt % to 70 wt %, and the second inorganic fillers have a particle size ranging between a value larger than 1 µm and 100 µm; and
a copper foil disposed on the fluorine-containing substrate.

10. A printed circuit board, comprising:
a fluorine-containing substrate including:
a reinforcing material layer including a substrate and a plurality of first inorganic fillers, the first inorganic fillers being attached on the substrate and disposed in the reinforcing material layer, and the first inorganic fillers having a particle size ranging from 0.02 µm to 1 µm; and
a fluorine-containing resin layer covering the reinforcing material layer, the fluorine-containing resin layer including a plurality of second inorganic fillers, wherein the fluorine-containing resin layer is formed from a second solution containing 10 wt % to 70 wt % of a fluorine-containing resin, 1 wt % to 10 wt % of a fluorine-containing polymer, 0.1 wt % to 50 wt % of a low molecular weight polytetrafluoroethylene, and 0.1 wt % to 10 wt % of an immersing auxiliary, a content of the second inorganic fillers in the fluorine-containing resin layer is from 20 wt % to 70 wt %, and the second inorganic fillers have a particle size ranging between a value larger than 1 µm and 100 µm; and
a circuit layer disposed on the fluorine-containing substrate.

* * * * *